United States Patent
Arvin et al.

(10) Patent No.: US 9,793,232 B1
(45) Date of Patent: Oct. 17, 2017

(54) ALL INTERMETALLIC COMPOUND WITH STAND OFF FEATURE AND METHOD TO MAKE

(71) Applicant: INTERNATIONAL BUSINESS MACHINES CORPORATION, Armonk, NY (US)

(72) Inventors: Charles L. Arvin, Poughkeepsie, NY (US); Luc Guerin, Quebec (CA); Sylvain Ouimet, Quebec (CA); Sylvain Pharand, Quebec (CA); Thomas A. Wassick, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/988,077

(22) Filed: Jan. 5, 2016

(51) Int. Cl.
*H01L 21/44* (2006.01)
*H01L 23/00* (2006.01)
*C22C 9/06* (2006.01)

(52) U.S. Cl.
CPC ............... *H01L 24/13* (2013.01); *C22C 9/06* (2013.01); *H01L 24/05* (2013.01); *H01L 24/81* (2013.01); *H01L 2224/0401* (2013.01); *H01L 2224/05147* (2013.01); *H01L 2224/10152* (2013.01); *H01L 2224/13111* (2013.01); *H01L 2224/13139* (2013.01); *H01L 2224/13147* (2013.01); *H01L 2224/81815* (2013.01)

(58) Field of Classification Search
CPC .......... H01L 2924/01028; H01L 24/13; H01L 24/81; H01L 2224/81; H01L 2224/16503; H01L 2224/16227; H01L 2224/45147

USPC ........ 438/613, 614, 615; 257/780, 781, 784, 257/786
See application file for complete search history.

(56) References Cited

U.S. PATENT DOCUMENTS

| | | | | |
|---|---|---|---|---|
| 5,356,833 A | * | 10/1994 | Maniar | ................ C23C 14/185 257/E21.011 |
| 5,950,073 A | * | 9/1999 | Griffin, IV | ............. H01L 23/10 257/704 |
| 6,906,417 B2 | * | 6/2005 | Jiang | ...................... H01L 24/16 228/180.22 |
| 7,393,214 B2 | | 7/2008 | DiStefano | |
| 8,013,428 B2 | | 9/2011 | Hooghan et al. | |
| 8,039,960 B2 | * | 10/2011 | Lin | ........................ H01L 24/11 257/737 |
| 8,093,101 B2 | | 1/2012 | Sakinada et al. | |
| 8,242,010 B2 | * | 8/2012 | Buchwalter | ........... H01L 21/563 174/255 |

(Continued)

FOREIGN PATENT DOCUMENTS

JP        2000100601 A    4/2000

OTHER PUBLICATIONS

C-M. Chen et al., "Interfacial Reactions and Mechanical Properties of Ball-Grid-Array Solder Joints Using Cu-Cored Solder Balls," Journal of Electronic Materials, vol. 35, No. 11, 2006, pp. 1937-1947.

(Continued)

*Primary Examiner* — S. V. Clark
(74) *Attorney, Agent, or Firm* — Cantor Colburn LLP

(57) ABSTRACT

A standoff structure for providing improved interconnects is provided, wherein the structure employs nickel copper alloy or copper structures having increased resistivity.

20 Claims, 2 Drawing Sheets

(56) References Cited

U.S. PATENT DOCUMENTS

| | | | |
|---|---|---|---|
| 8,476,773 B2 * | 7/2013 | Buchwalter | H01L 21/563 |
| | | | 174/255 |
| 8,562,906 B2 | 10/2013 | Tanaka et al. | |
| 8,928,141 B2 * | 1/2015 | Souriau | H01L 24/13 |
| | | | 257/737 |
| 9,129,981 B2 | 9/2015 | Yap et al. | |
| 2001/0048591 A1 * | 12/2001 | Fjelstad | H01L 23/49816 |
| | | | 361/767 |
| 2007/0298609 A1 * | 12/2007 | Yakobson | H01L 21/288 |
| | | | 438/653 |
| 2010/0059244 A1 | 3/2010 | Ishii | |
| 2013/0256885 A1 | 10/2013 | Warren et al. | |

OTHER PUBLICATIONS

Y. Kim et al., "Fracture Behavior of Cu-Cored Solder Joints," Journal of Materials Science, vol. 46, No. 21, 2011, pp. 6897-6903.

* cited by examiner

ALL INTERMETALLIC COMPOUND WITH STAND OFF FEATURE AND METHOD TO MAKE

BACKGROUND

The invention relates to semiconductor device packaging and, more particularly, to techniques for surface mount technology (SMT) for mounting SMT components to substrates, and providing an improved solder joint.

With the trend for higher wiring density and improved electrical performance in flip chip plastic ball grid array (FCPBGA) laminate chip carriers, it is desirable to place passive components, such as capacitors, on the chip carriers as close to the chip as possible. Recent developments in capacitor technology have resulted in small multi-terminal ceramic capacitors. These capacitors are typically soldered directly onto copper (Cu) pads on the FCPBGA laminates. Typical multi-terminal capacitors have 6-10 terminals, requiring a like number of solder joints, per capacitor. The capacitor may be on the top or the bottom of the laminate chip carrier. (The "laminate" chip carrier may also be referred to as an "organic" substrate.)

Surface Mount Technology (SMT) is a technique for populating hybrids, multichip modules, and circuit boards, in which packaged components are mounted directly onto the surface of the substrate. A layer of solder paste is screen printed onto the pads and the components are attached by pushing their leads into the paste. When all of the components have been attached, the solder paste is melted using either reflow soldering or vapor-phase soldering.

A surface mount device (SMD) or component is an electronic component, ranging from discrete passive components, such as chip resistors and chip capacitors, to VLSI (very large scale integration) chips, attached to the surface of a substrate such as a printed circuit board or a ball grid array (BGA) package substrate, either directly or through a surface-mount connector, rather than by means of wires, leads or holes in the board.

Flip Chip technology is a type of SMT, and refers to situations where a device—typically a device having solder bumps—is mounted face-down (active side down) onto a substrate.

SUMMARY

According to an embodiment of the present invention, a method is provided for forming an all intermetallic interconnect while minimizing consumption of base metallurgy from the contact pad by: placing a spacer comprising an intermetallic core and a surface layer of an alloy of copper and 5% to 10% nickel, based on total weight of copper, in contact with a tin-containing solder on a contact pad containing base metal selected from copper, nickel and combinations thereof, prior to chip placement, the copper nickel alloy being present in an amount greater than about ⅓ the mass of the solder; placing a chip on the contact pad site; and annealing the spacer and solder, either before or after underfill, to form an all intermetallic interconnect joining the contact pad and a lead on the chip.

According to another embodiment of the present invention, a method is provided for forming an all intermetallic interconnect while minimizing consumption of base metallurgy from the contact pad comprising: placing a spacer comprising an alloy of copper and 5% to 10% nickel, based on total weight of copper, in contact with a tin-containing solder on a contact pad containing base metal selected from copper, nickel and combination thereof, prior to chip placement, the copper nickel alloy being present in an amount greater than about ⅓ the mass of the solder; placing a chip on the contact pad site; and annealing the spacer and solder, either before or after underfill, to form an all intermetallic interconnect joining the contact pad and a lead on the chip.

According to another embodiment of the present invention, an all intermetallic interconnect is provided containing a contact pad on a laminate joined to an annealed mass derived from a tin-containing solder and a nickel-copper alloy standoff structure comprising 5% to 10% nickel based on total weight of copper, the copper nickel alloy being present in an amount greater than about ⅓ the mass of the tin in the solder to less than an amount that would produce a short.

DETAILED DESCRIPTION

Figure 1:
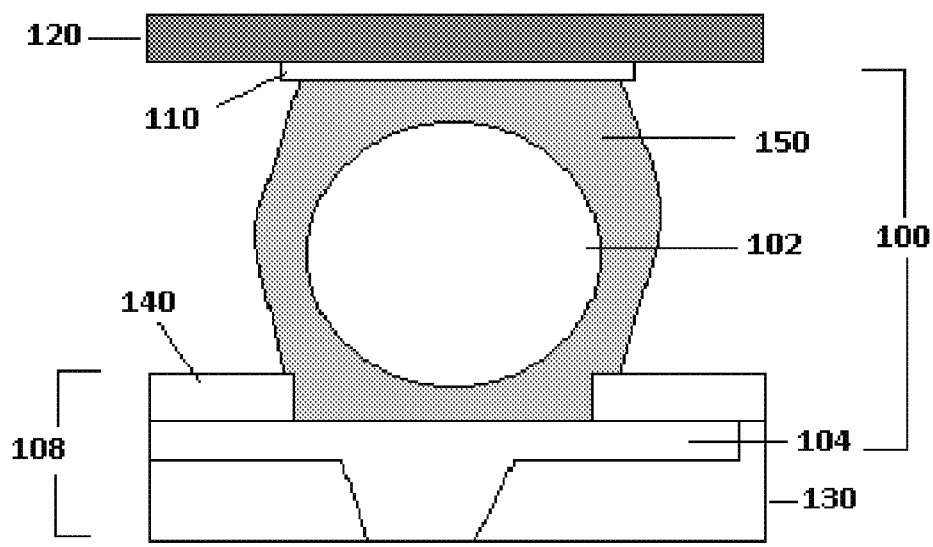
FIG. 1 is a cross-sectional view of an interconnect containing a standoff structure.

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) may be used to identify elements. If legends are provided, they are intended merely as an aid to the reader, and should not in any way be interpreted as limiting.

An all intermetallic interconnect provides higher resistivity but an improved electromigration performance as compared to an interconnect that has free solder and a conductive metal within. Thus, if standoff structures are used, they must enable a full intermetallic joint without compromising the base metallurgy on either the laminate or die side. Standoff structures containing a NiCu alloy are provided to enable the rapid and full conversion of tin-containing solders to an all intermetallic joint without impacting the substrate or requiring any modification to standard laminate or silicon die processing.

The nickel alloy may be used in the form of NiCu balls, columns, stars, dimpled spheres, pyramids, etc. onto the laminate pre-solder prior to chip join. The overall atomic mass of the alloy must be a minimum of ⅓ of the atomic mass of the solder with an upper mass that still enables the pitch of the interconnect to be formed without shorting.

The standoff structure can be used on contact pads having pad diameter of 5 micron to 120 micron; 40 micron to 110 micron; 70 micron to 92 micron. Stand-off height between the contact pad and its interconnected device is set to a predetermined dimension by way of a spacer positioned between the surface mount component and a contact pad on the printed circuit board. The spacer has predetermined dimensions such that its placement in relation to the surface mount component defines the stand-off height dimension.

A trend in the industry is to replace Sn/Pb (tin/lead) solder with Pb free (lead free) solders. Examples of Pb free solder alloys are SnAgCu (or "SAC"; tin-silver-copper) alloys and SnCu (tin-copper) compositions. A typical SAC alloy contains 3.0% Ag. A typical SnCu composition contains 99.3% Sn and 0.7% Cu. It is known in the industry that SAC alloy solders are less ductile than traditional SnPb alloys. Other exemplary lead-free alloys include 97.2% Sn and 1.8% Ag, 99.5% Sn and 0.5% Ag.

Transport of silver (Ag) and tin (Sn) elements from the solder bump can form an intermetallic material with copper (Cu), such as copper tin (Cu—Sn) intermetallics and copper nickel tin (Cu—Ni—Sn) intermetallics. The interaction between copper (Cu) and tin (Sn) in forming intermetallics, such as $Cu_3Sn$, can result in the formation of voids, e.g., Kirkendall voids. This may result in the formation of an intermetallic alloy, such as tin copper (Sn—Cu) alloy, a nickel-tin (Ni—Sn) alloy, a tin-silver (Sn—Ag) alloy, a copper-nickel-tin (Cu—Ni—Sn) alloy, a copper-silver (Cu—Ag) alloy, a copper-nickel-silver (Cu—Ni—Ag) alloy or a tin-copper-silver (Sn—Cu—Ag) alloy, a nickel-tin-silver (Ni—Sn—Ag) alloy, a nickel-silver (Ni—Ag) alloy, a nickel-copper-tin-silver (Ni—Cu—Sn—Ag) alloy or a combination thereof.

A nickel copper alloy of 5% to 10% Ni reacts with non-lead based solders to convert to an all intermetallic join ($Cu_6Sn_5$, $Cu_3Sn$, $Ni_3Sn_4$, $Cu_6Sn_5$, $Cu_3Sn$, $(Cu_{0.95}Ni_{0.05})_6Sn_5$, $(Cu_{0.90}Ni_{0.10})_6Sn_5$, $(Cu_{0.95}Ni_{0.05})_3Sn$ and $(Cu_{0.90}Ni_{0.10})_3Sn$ etc.) at a conversion rate that is 5 times faster than that between Cu and tin based solders.

The NiCu alloy containing structure can be placed on top of the pre-solder of a traditional laminate prior to chip join/placement. This can be done either at the laminate vendor or at a subsequent packaging house. Then, the chip is joined to the top side of the standoff structure.

Depending upon the application, the anneal can occur either before or after underfill, to convert all of the lead-free solder to an intermetallic structure.

After chip join and a subsequent anneal, the solder will reach the NiCu core leading to a fast conversion of the solder to all intermetallic. The fact that there still exists free solder until the anneal, will enable rework if necessary for modules that have multiple components/die where a rework is desired such as a multiple CSP application.

In another aspect, an interconnect containing a porous copper sphere is provided to increase the penetration of intermetallic into the sphere to inhibit electron transport through its center, providing a more resistive interconnect than would be possible with a solid copper standoff structure. This avoids creating what effectively would be an electron lens which would otherwise concentrate electrons upon exit from the stand off leading to localized high current densities within the joint. Another embodiment of the copper structure of increased resistance would be a multi-point star pattern structure which contacts the conductors out of direct alignment with the center of mass of the interconnect.

Figure 2:
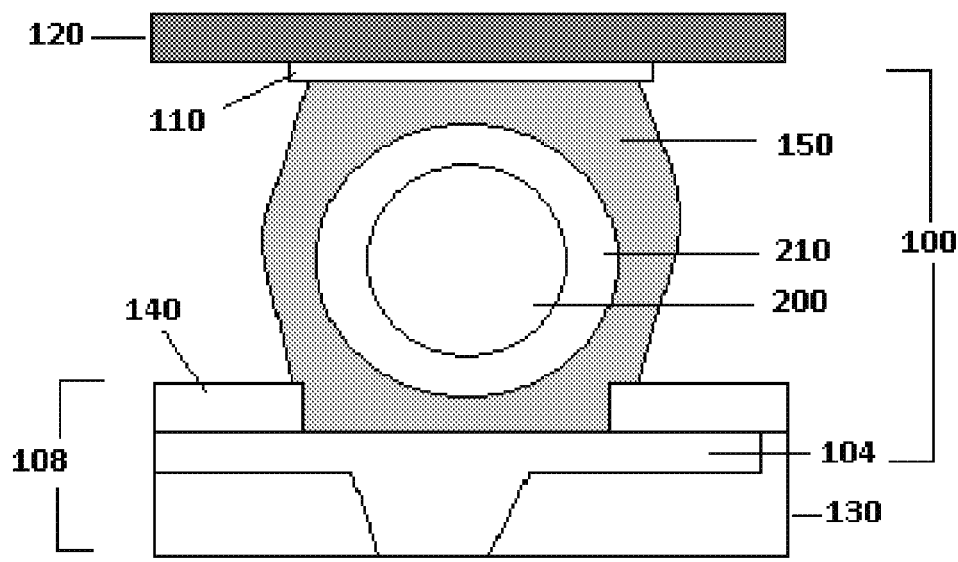
FIG. 2 is a cross-sectional view of an interconnect containing a standoff structure having two layers of different materials.
Figure 3:
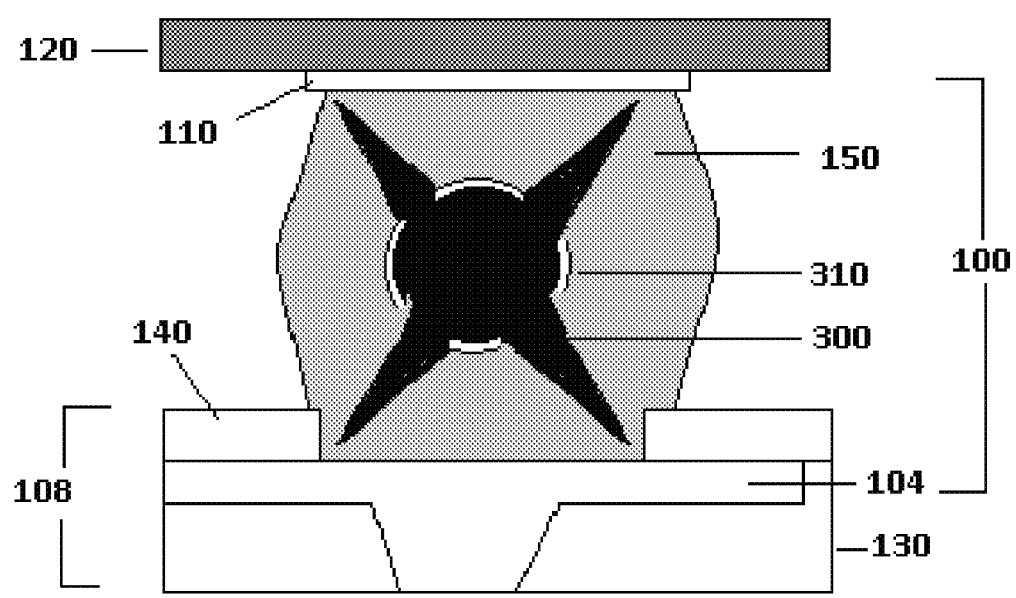
FIG. 3 is a cross-sectional view of an interconnect containing a standoff structure having projections.

With reference now to FIGS. 1-3. FIG. 1 is a cross-sectional side view of a C4 interconnect 100, containing a structure 102, positioned on a copper contact pad 104, located on a laminate 108, and in conductive proximity of an under bump metallization layer 110 on a surface mount component 120, such as a silicon chip in flip chip orientation. The laminate 108 contains an organic substrate layer 130 and a semiconductor mask layer 140 which defines the outline of the copper pad 104. Lead-free solder 150 is in contact with the copper pad 104, the structure 102, and the under bump metallization layer 110.

A flux is used in the process of attaching the capacitor (surface mount component) to ensure wetting of the solder to the capacitor tab. A variety of fluxes may be used, but typically a water soluble flux is used. Since residual flux can create a reliability concern, in the assembly process there is typically a wash step after assembly to remove traces of residual flux.

An advantage of the invention is that washing (cleaning) of residual flux can be enhanced by increasing the gap between the component and the laminate, and also by the amount of open area. As demonstrated by the embodiments of FIGS. 1-3, a variety of standoff element shapes can readily be implemented, and flux removal can be accommodated without sacrificing the standoff structure's principal function of increasing standoff height (SH).

In FIG. 1, the structure 102 is composed of a nickel-copper alloy containing 5 weight percent to 10 weight percent nickel.

In FIG. 2, the structure 102 is composed of an intermetallic 200 with a layer of nickel-copper alloy 210 containing 5 weight percent to 10 weight percent nickel on the surface of the structure 102.

In FIG. 3, the structure 102 is an irregular shaped structure 300 composed of copper with a layer of nickel-copper alloy 310 containing 5 weight percent to 10 weight percent nickel on the surface of the structure 102.

Upon heating the interconnect 100 shown in FIG. 1 or 2 to anneal the interconnect 100, the nickel-copper alloy rapidly converts the lead-free solder 150 to an all intermetallic joint.

The component 120 is, for example, a passive component such as capacitor having a ceramic body portion, and a pair of terminals (surface mount terminations, or "tabs") Each terminal is generally C-shaped, and extends around the side of the component body to under the bottom (as viewed) and over the top (as viewed) surfaces of the component body. The terminals are solderable (solder wettable).

The surface mount component is suitably an interdigitated capacitor (IDC) which is a ceramic chip capacitor having multiple pairs of terminals, such as the aforementioned IDC chip capacitors from AVX Corp.

The substrate (also referred to herein as "laminate", or "organic") 108 is an interconnect (wiring) substrate comprising, for example, an organic substrate 130 having metal contact (terminal) pads 104 having areas which are exposed on a surface (top, as viewed) of the substrate 122 for connecting to (by soldering) respective terminals 104 of the surface mount component 100. The exposed areas of the pads 104 is defined by openings in a mask layer 140. The exposed areas of the pads 104 are sized and spaced to align with the terminals 110 of the surface mount component.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an all intermetallic interconnect while minimizing consumption of base metallurgy from the contact pad comprising:
    placing a spacer comprising an intermetallic core and a surface layer of an alloy of copper and 5% to 10% nickel, based on total weight of copper, in contact with a tin-containing solder on a contact pad containing base metal selected from copper, nickel and combinations thereof, prior to component placement, the copper nickel alloy being present in an amount greater than about ⅓ the mass of the solder;
    placing a component on the contact pad site; and
    annealing the spacer and solder, either before or after underfill, to form an all intermetallic interconnect joining the contact pad and a lead on the component.

2. The method of claim 1, wherein the spacer is in a shape having a normalized aspect ratio of 0.6 to 1.0; 0.7 to 1.0; 0.8 to 1.

3. The method of claim 1, wherein the spacer is in a shape that is spherical, ovoid, cubic, multi-faceted regular prismatic, multi-faceted irregular, multi-pointed regular stellar or multi-pointed irregular.

4. The method of claim 1, wherein the contact pad diameter is 5 micron to 120 micron.

5. The method of claim 1, wherein the solder is selected from tin-silver-copper alloy and tin-copper alloy.

6. A method of forming an all intermetallic interconnect while minimizing consumption of base metallurgy from the contact pad comprising:
    placing a spacer comprising an alloy of copper and 5% to 10% nickel, based on total weight of copper, in contact with a tin-containing solder on a contact pad containing base metal selected from copper, nickel and combination thereof, prior to component placement, the copper nickel alloy being present in an amount greater than about ⅓ the mass of the solder;
    placing a component on the contact pad site; and
    annealing the spacer and solder, either before or after underfill, to form an all intermetallic interconnect joining the contact pad and a lead on the component.

7. The method of claim 6, wherein the contact pad diameter is 5 micron to 120 micron.

8. The method of claim 6, wherein the contact pad diameter is 70 micron to 92 micron.

9. The method of claim 6, wherein the solder is selected from tin-silver-copper alloy and tin-copper alloy.

10. The method of claim 6, wherein the intermetallic is selected from $Cu_6Sn_5$, $Cu_3Sn$, $(Cu_{0.95}Ni_{0.05})_6Sn_5$, $(Cu_{0.90}Ni_{0.10})_6Sn_5$, $(Cu_{0.95}Ni_{0.05})_3Sn$ and $(Cu_{0.90}Ni_{0.10})_3Sn$.

11. The method of claim 6, wherein the spacer is a porous body in a shape that is spherical, ovoid, cubic, or multi-faceted regular prismatic.

12. The method of claim 6, wherein the spacer is an irregular shape selected from multi-pointed stellar or multi-pointed irregular.

13. The method of claim 6, wherein the contact pad diameter is 5 micron to 120 micron.

14. An all intermetallic interconnect comprising a contact pad on a laminate joined to an annealed mass derived from a tin-containing solder and a nickel-copper alloy standoff structure comprising 5% to 10% nickel based on total weight of copper, the copper nickel alloy being present in an amount greater than about ⅓ the mass of the tin in the solder to less than an amount that would produce a short.

15. The all intermetallic interconnect of claim 14, wherein the contact pad diameter is 5 micron to 120 micron.

16. The all intermetallic interconnect of claim 14, wherein the contact pad diameter is 70 micron to 92 micron.

17. The all intermetallic interconnect of claim 14, wherein the solder is selected from tin-silver-copper alloy and tin-copper alloy.

18. The all intermetallic interconnect of claim 14, wherein the alloy of copper and 5% to 10% nickel, based on total weight of copper is a surface layer of an intermetallic core.

19. The all intermetallic interconnect of claim 14, wherein the nickel-copper alloy standoff structure consists of 5% to 10% nickel, based on total weight of copper.

20. The all intermetallic interconnect of claim 14, wherein the intermetallic is selected from $Cu_6Sn_5$, $Cu_3Sn$, $(Cu_{0.95}Ni_{0.05})_6Sn_5$, $(Cu_{0.90}Ni_{0.10})_6Sn_5$, $(Cu_{0.95}Ni_{0.05})_3Sn$ and $(Cu_{0.90}Ni_{0.10})_3Sn$.

* * * * *